(12) United States Patent
Hashizume (10) Patent No.: US 7,197,693 B2
(45) Date of Patent: Mar. 27, 2007

(54) CONNECTION VERIFICATION APPARATUS FOR VERIFYING INTERCONNECTION BETWEEN MULTIPLE LOGIC BLOCKS

(75) Inventor: Takeshi Hashizume, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 646 days.

(21) Appl. No.: 10/352,231

(22) Filed: Jan. 28, 2003

(65) Prior Publication Data

US 2004/0019840 A1   Jan. 29, 2004

(30) Foreign Application Priority Data

Jul. 29, 2002   (JP) ............................. 2002-220061

(51) Int. Cl.
  G06F 7/02   (2006.01)
  G01R 31/28  (2006.01)
  G01R 31/08  (2006.01)
(52) U.S. Cl. ................. 714/819; 714/724; 324/527
(58) Field of Classification Search ............ 714/724, 714/738, 819; 716/4; 324/527, 756
  See application file for complete search history.

(56) References Cited

U.S. PATENT DOCUMENTS

| | | | | |
|---|---|---|---|---|
| 4,949,274 A | * | 8/1990 | Hollander et al. ........... 324/142 |
| 5,029,166 A | * | 7/1991 | Jarwala et al. .............. 714/724 |
| 5,903,156 A | * | 5/1999 | Matsumaru et al. ........ 324/533 |
| 5,999,002 A | * | 12/1999 | Fasnacht et al. ............ 324/525 |
| 6,574,758 B1 | * | 6/2003 | Eccles ......................... 714/712 |
| 6,617,869 B1 | * | 9/2003 | Pillkahn ....................... 324/763 |
| 6,894,308 B2 | * | 5/2005 | Whetsel et al. ............... 257/48 |

FOREIGN PATENT DOCUMENTS

JP    10-239394    9/1998

* cited by examiner

*Primary Examiner*—Cynthia Britt
(74) *Attorney, Agent, or Firm*—Buchanan Ingersoll & Rooney PC (57) ABSTRACT

A connection verification apparatus verifies interconnection between a plurality of logic blocks constituting a semiconductor integrated circuit or the like. It includes a connection verification section for verifying interconnection between a first logic block and a second logic block by comparing a signal level of an output terminal of the first logic block with a signal level of an input terminal of the second logic block connected to the output terminal of the first logic block. The connection verification apparatus can verify the interconnection between the two logic blocks without verifying the logic processing to the two logic blocks.

13 Claims, 14 Drawing Sheets

SIGNAL GENERATING SECTION (21)

```
integer TP;
initial begin
    force Y=YN;
    #0; TP=0;
    #0; TP=1;
    #0; TP=2;
    #0; TP=3;
    #0; TP=4;
    #0; TP=5;
    #0; TP=6;
    #0; TP=7;
    #0; TP=8;
    release Y;
end
always@(TP)begin
    if(TP==0) YN = 3'b000;  ⎫
    if(TP==1) YN = 3'b001;  ⎪
    if(TP==2) YN = 3'b010;  ⎪
    if(TP==3) YN = 3'b011;  ⎬ TEST SIGNAL
    if(TP==4) YN = 3'b100;  ⎪
    if(TP==5) YN = 3'b101;  ⎪
    if(TP==6) YN = 3'b110;  ⎪
    if(TP==7) YN = 3'b111;  ⎪
    if(TP==8) YN = 3'bzzz;  ⎭
end
```

CONNECTION VERIFICATION SECTION (22)

```
always@(AN)begin
    if(TP<8)begin
        if(A!== AN)connect_error= 1'b1;
    end
end
initial begin
    #0; TP=0;
    #0; TP=1;
    #0; TP=2;
    #0; TP=3;
    #0; TP=4;
    #0; TP=5;
    #0; TP=6;
    #0; TP=7;
    #0; TP=8;
end
always@(TP)begin
    if(TP==0) #0 AN = 3'b000;  ⎫
    if(TP==1) #0 AN = 3'b001;  ⎪
    if(TP==2) #0 AN = 3'b010;  ⎪ EXPECTED VALUES
    if(TP==3) #0 AN = 3'b011;  ⎬ MATCHED TO TEST
    if(TP==4) #0 AN = 3'b100;  ⎪ SIGNAL
    if(TP==5) #0 AN = 3'b101;  ⎪
    if(TP==6) #0 AN = 3'b110;  ⎪
    if(TP==7) #0 AN = 3'b111;  ⎪
    if(TP==8) #0 AN = 3'bzzz;  ⎭
end
```

CONNECTION VERIFICATION APPARATUS FOR VERIFYING INTERCONNECTION BETWEEN MULTIPLE LOGIC BLOCKS

BACKGROUND OF THE INVENTION

1. Field of the Invention

The present invention relates to a connection verification apparatus for verifying connections between a plurality of logic blocks constituting a semiconductor integrated circuit or the like during function design or logic design.

2. Description of Related Art

Figure 15:
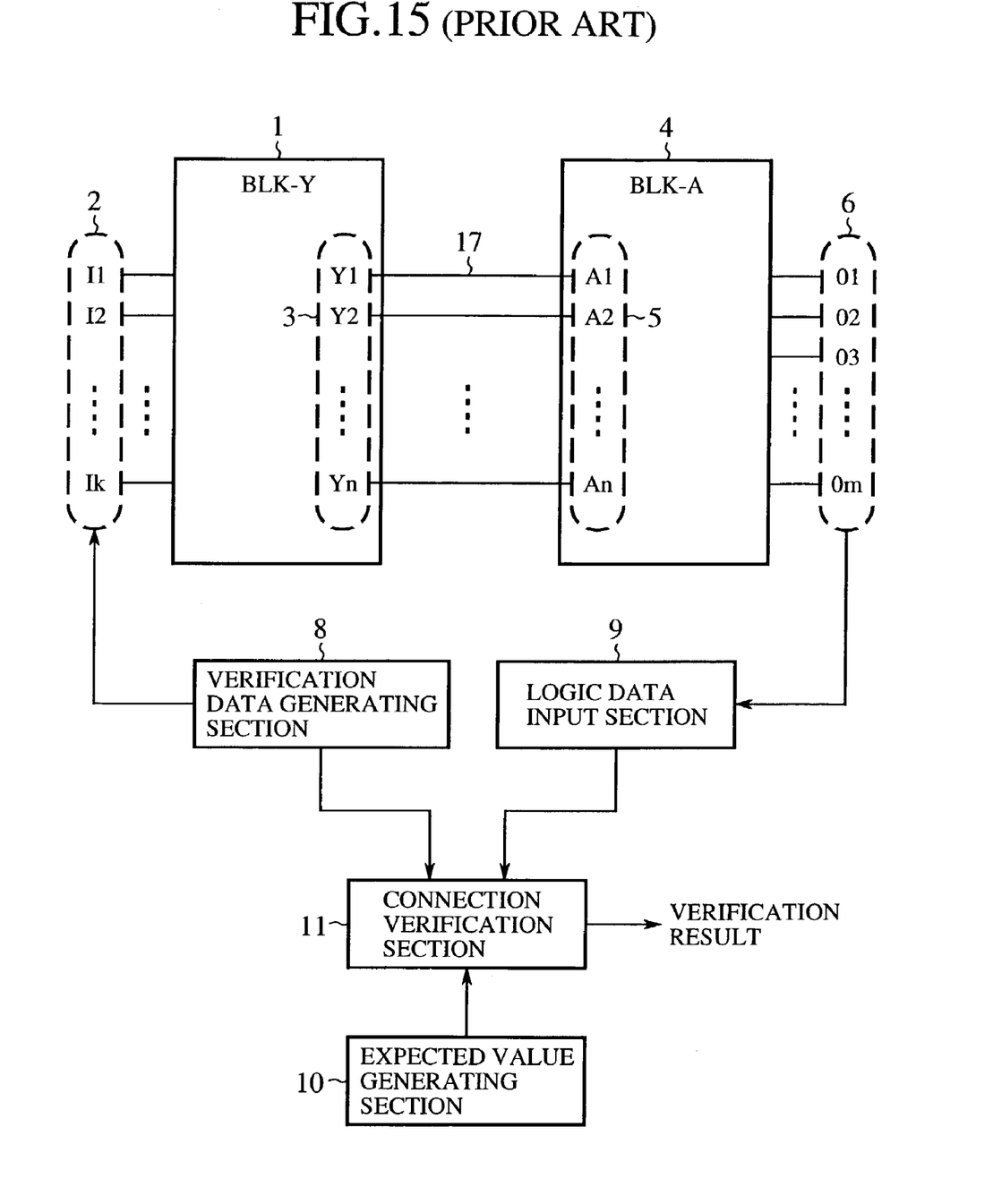
FIG. 15 is a block diagram showing a configuration of a conventional connection verification apparatus.

FIG. 15 is a block diagram showing a configuration of a conventional connection verification apparatus. In FIG. 15, the reference numeral 1 designates a logic block (called BLK-Y from now on) constituting a semiconductor integrated circuit, for example; 2 designates an input terminal of the BLK-Y 1; 3 designates an output terminal of the BLK-Y 1; 4 designates a logic block (called BLK-A from now on) constituting the semiconductor integrated circuit; 5 designates an input terminal of the BLK-A 4; 6 designates an output terminal of the BLK-A 4; 7 designates signal lines connecting between the output terminal 3 of the BLK-Y 1 and the input terminal 5 of the BLK-A 4; 8 designates a verification data generating section for supplying the input terminal 2 of the BLK-Y 1 with the verification data for verifying the functions (or logic) of the BLK-Y 1 and BLK-A 4 (including the interconnection between the BLK-Y 1 and BLK-A 4); 9 designates a logic data input section for receiving the logic data output from the output terminal 6 of the BLK-A 4; 10 designates an expected value generating section for generating an expected value of the logic data output from the output terminal 6 of the BLK-A 4; and 11 designates a connection verification section for verifying the interconnection between the BLK-Y 1 and BLK-A 4 besides the function (logic) of the BLK-Y 1 and BLK-A 4 referring to the verification data generated by the verification data generating section 8, the logic data supplied from the logic data input section 9 and the expected value generated by the expected value generating section 10.

Next, the operation of the conventional connection verification apparatus will be described.

To verify the interconnection between the BLK-Y 1 and BLK-A 4, the verification data generating section 8 supplies the input terminal 2 of the BLK-Y 1 with the dedicated verification data. In other words, it supplies the input terminals I1–Ik with the verification data, each bit of which consists of the signal value "1" or "0".

Receiving the verification data from the input terminal 2, the BLK-Y 1 carries out prescribed logic processing in accordance with the verification data, and outputs the resultant logic data via the output terminal 3.

In this way, when the interconnection between the output terminals Y1–Yn of the BLK-Y 1 and the input terminals A1–An of the BLK-A 4 is normal, the logic data the BLK-Y 1 outputs is supplied to the input terminal 5 of the BLK-A 4 via the signal lines 7.

Receiving the logic data via the input terminal 5, the BLK-A 4 carries out the prescribed logic processing in accordance with the logic data, and supplies the resultant logic data to the output terminal 6.

The logic data input section 9 receives the logic data output from the output terminal 6 of the BLK-A 4. In other words, it receives the logic data, each bit of which consists of the signal value "1" or "0", via the output terminals O1–Om.

Referring to the verification data generated by the verification data generating section 8, the logic data supplied from the logic data input section 9 and the expected value generated by the expected value generating section 10, the connection verification section 11 verifies the interconnection between the BLK-Y 1 and BLK-A 4 along with the functions of the two blocks.

More specifically, the connection verification section 11 verifies the interconnection between the BLK-Y 1 and BLK-A 4 by verifying the logic processing of the BLK-Y 1 when the verification data is supplied, by verifying the logic processing of the BLK-A 4 when the logic result of the BLK-Y 1 is supplied, and by comparing the logic data (logic result of the BLK-A 4) output from the output terminal 6 of the BLK-A 4 with the expected value generated by the expected value generating section 10.

With the foregoing configuration, the conventional connection verification apparatus cannot verify the interconnection between the BLK-Y 1 and BLK-A 4 until it completes the verification of the logic processing of the BLK-Y 1 and BLK-A 4. Accordingly, it has a problem in that as the logic processing of the BLK-Y 1and BLK-A 4 increase in complexity, the verification of the interconnection between the BLK-Y 1 and BLK-A 4 becomes more difficult.

SUMMARY OF THE INVENTION

The present invention is implemented to solve the foregoing problem. It is therefore an object of the present invention to provide a connection verification apparatus capable of verifying the interconnection between a plurality of logic blocks without verifying the logic processing of the logic blocks.

According to a first aspect of the present invention, there is provided a connection verification apparatus including a connection verification section for verifying interconnection between a first and second logic blocks by comparing a signal level of an output terminal of the first logic block with a signal level of an input terminal of the second logic block connected to the output terminal of the first logic block. The connection verification apparatus can verify the interconnection between the two logic blocks without verifying the logic processing of the two logic blocks.

According to a second aspect of the present invention, there is provided a connection verification apparatus including a connection verification section for verifying interconnection between a first and second logic blocks by supplying a test signal generated by a signal generating section to an output terminal of the first logic block, and by comparing the signal level of the output terminal of the first logic block with a signal level of an input terminal of the second logic block connected to the output terminal of the first logic block. The connection verification apparatus can verify the interconnection between the two logic blocks without verifying the logic processing of the two logic blocks.

DETAILED DESCRIPTION OF THE PREFERRED EMBODIMENTS

The invention will now be described with reference to the accompanying drawings.

Embodiment 1

Figure 1:
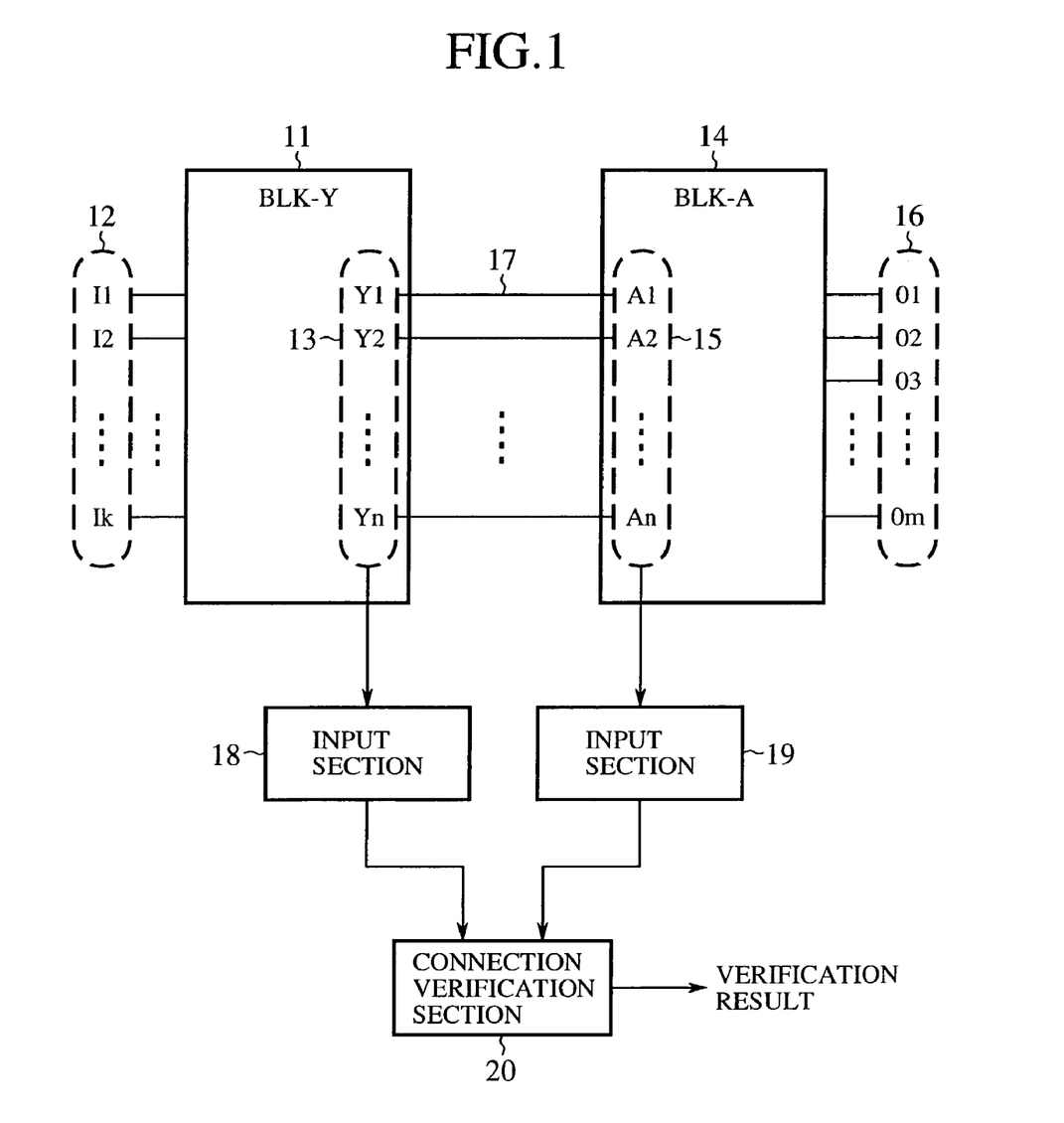
FIG. 1 is a block diagram showing a configuration of an embodiment 1 of the connection verification apparatus in accordance with the present invention.

FIG. 1 is a block diagram showing a configuration of an embodiment 1 of the connection verification apparatus in accordance with the present invention. In FIG. 1, the reference numeral 11 designates a BLK-Y (first logic block) constituting a semiconductor integrated circuit or the like; 12 designates an input terminal of the BLK-Y 11; 13 designates an output terminal of the BLK-Y 11; 14 designates a BLK-A (second logic block) constituting the semiconductor integrated circuit; 15 designates an input terminal of the BLK-A 14; 16 designates an output terminal of the BLK-A 14; and 17 designates signal lines interconnecting the output terminal 13 of the BLK-Y 11 and the input terminal 15 of the BLK-A 14.

The reference numeral 18 designates an input section for receiving the signal level of the output terminal 13 of the BLK-Y 11; and 19 designates an input section for receiving the signal level of the input terminal 15 of the BLK-A 14. The reference numeral 20 designates a connection verification section for comparing the signal level supplied from the input section 18 with the signal level supplied from the input section 19 to verify the interconnection between the BLK-Y 11 and the BLK-A 14.

Next, the operation of the present embodiment 1 will be described.

When the input terminals I1–Ik constituting the input terminal 12 of the BLK-Y 11 are supplied with external data, each bit of which consists of a signal value "1" or "0", the BLK-Y 11 carries out prescribed logic processing in accordance with the data, and supplies the resultant logic data to its output terminal 13.

When the interconnection between the output terminals Y1–Yn of the BLK-Y 11 and the input terminals A1–An of the BLK-A 14 are normal, the logic data output from the BLK-Y 11 is supplied to the input terminal 15 of the BLK-A 14 via the signal lines 17.

The input section 18 receives the signal level from the output terminal 13 of the BLK-Y 11, and the input section 19 receives the signal level from the input terminal 15 of the BLK-A 14.

The connection verification section 20 verifies the interconnection between the BLK-Y 11 and BLK-A 14 by comparing the signal level supplied from the input section 18 with the signal level supplied from the input section 19.

More specifically, it compares the signal levels of the output terminals Y1–Yn with those of the input terminals A1–An, and when they are identical at all the corresponding terminals, it outputs a verification result indicating normal connection, whereas at least one of them is not identical, it outputs a verification result indicating abnormal connection. Although the verification result of the entire interconnection between the BLK-Y 11 and BLK-A 14 is output rather than the verification results of the interconnections between the individual terminals here, it is also possible to output the verification results of the interconnections between the individual terminals.

As described above, the present embodiment 1 is configured such that it compares the signal levels of the output terminals Y1–Yn with those of the input terminals A1–An to verify the interconnection between the BLK-Y 11 and BLK-A 14. Accordingly, it offers an advantage of being able to verify the interconnection between the BLK-Y 11 and BLK-A 14 without verifying the logic processing of the BLK-Y 11 and BLK-A 14.

Incidentally, since the signal levels of the output terminals Y1–Yn and input terminals A1–An vary depending on the signal values supplied to the input terminals I1–Ik of the BLK-Y 11, stuck-at fault of the signals can also be detected.

Although the present embodiment 1 shows a configuration that includes the input sections 18 and 19 and the connection verification section 20 outside the BLK-Y 11 and BLK-A 14, this is not essential. For example, the input sections 18 and 19 and the connection verification section 20 can be installed inside the BLK-Y 11 or BLK-A 14.

Embodiment 2

Figure 2:
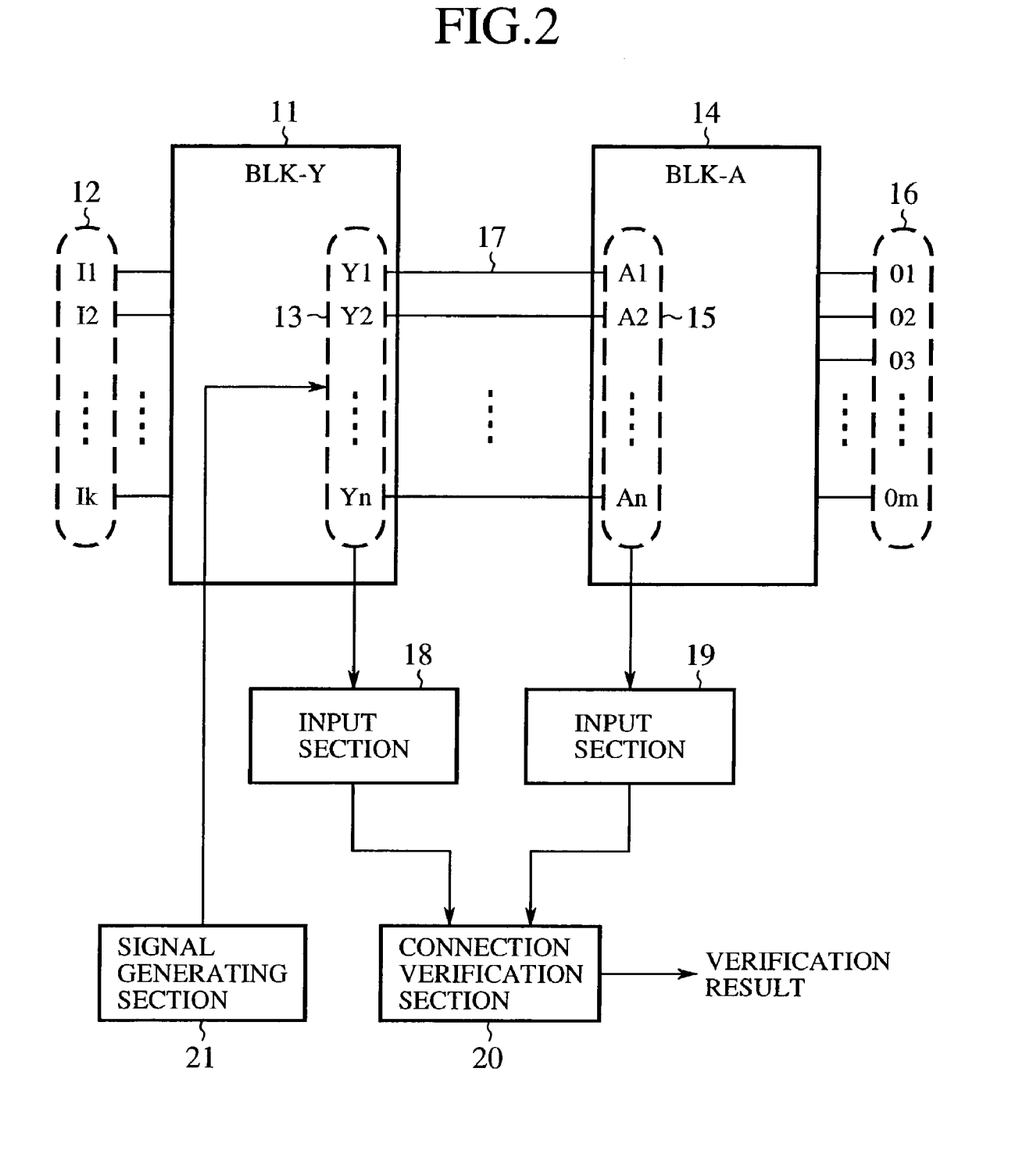
FIG. 2 is a block diagram showing a configuration of an embodiment 2 of the connection verification apparatus in accordance with the present invention.

FIG. 2 is a block diagram showing a configuration of an embodiment 2 of the connection verification apparatus in accordance with the present invention. In FIG. 2, the same reference numerals designate the same or like portions to those of FIG. 1, and the description thereof is omitted here.

In FIG. 2, the reference numeral 21 designates a signal generating section for generating a test signal for the connection verification, and for supplying the test signal to the output terminal 13 of the BLK-Y 11.

Although the foregoing embodiment 1 verifies the interconnection between the BLK-Y 11 and BLK-A 14 when the input terminals I1–Ik of the BLK-Y 11 are supplied with the external data, this is not essential. For example, a configuration is also possible in which the signal generating section 21 generates the test signal for the connection verification, and supplies it to the output terminal 13 of the BLK-Y 11.

For example, when the signal generating section 21 supplies the output terminal Y1 of the BLK-Y 11 with the test signal for the connection verification whose signal value varies such as "1"→"0"→"1", and the signal level of the input terminal A1 of the BLK-A 14 varies such as "1"→"0"→"1", the connection verification section 20 makes a decision that the output terminal Y1 of the BLK-Y 11 is connected to the input terminal A1 of the BLK-A 14 normally.

The present embodiment 2 can verify the interconnection between the BLK-Y 11 and BLK-A 14 without verifying the logic processing of the BLK-Y 11 and BLK-A 14 as the foregoing embodiment 1. In addition, it offers an advantage of being able to verify the interconnection between the BLK-Y 11 and BLK-A 14 even though no external data is supplied to the input terminals I1–Ik of the BLK-Y 11.

Embodiment 3

Figure 3:
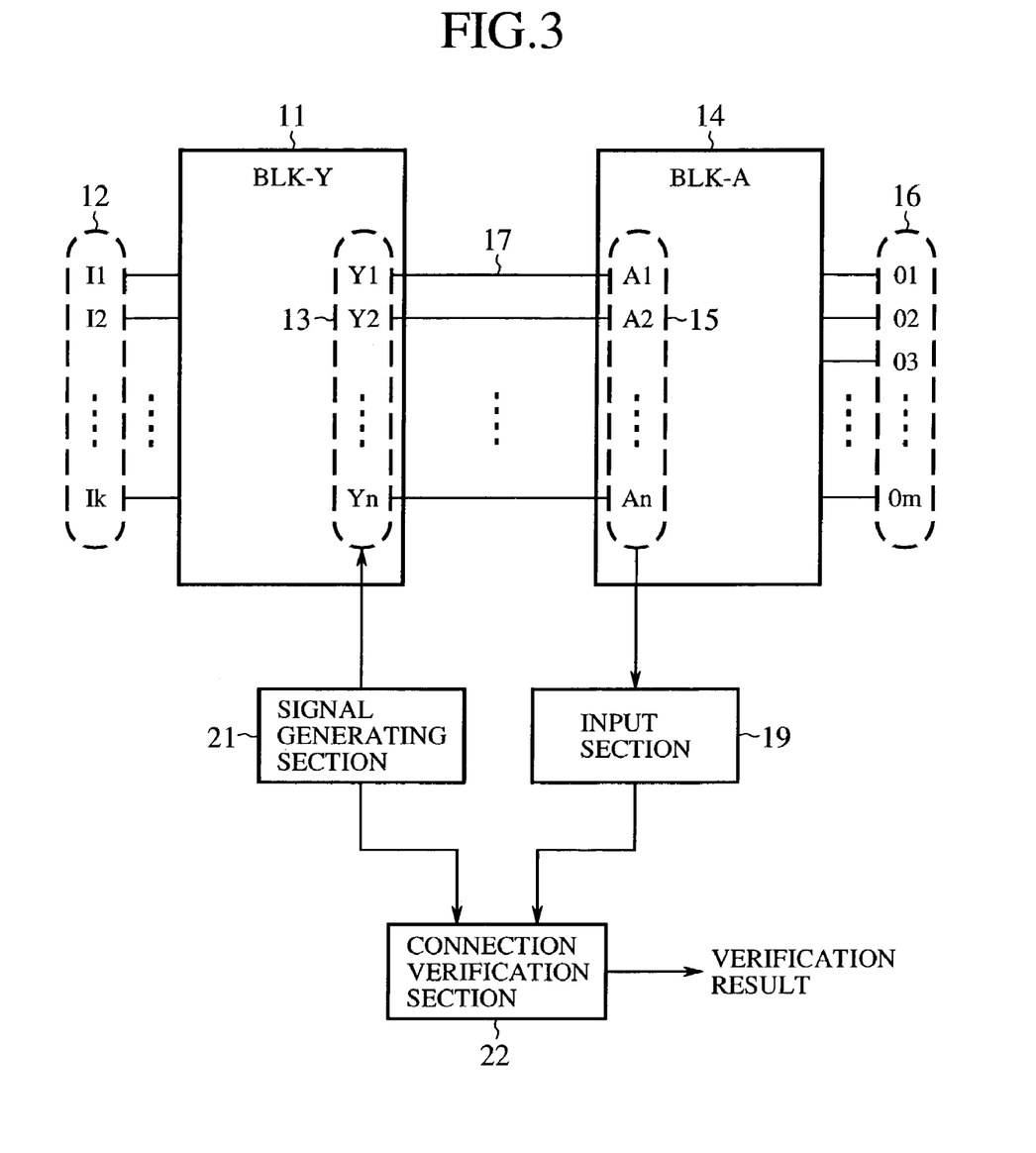
FIG. 3 is a block diagram showing a configuration of an embodiment 3 of the connection verification apparatus in accordance with the present invention.

FIG. 3 is a block diagram showing a configuration of an embodiment 3 of the connection verification apparatus in accordance with the present invention. In FIG. 3, the same reference numerals designate the same or like portions to those of FIG. 2, and the description thereof is omitted here.

In FIG. 3, the reference numeral 22 designates a connection verification section for comparing the signal level of the test signal generated by the generating section 21 with the signal level supplied from the input section 19 to verify the interconnection between the BLK-Y 11 and BLK-A 14.

The foregoing embodiment 2 verifies the interconnection between the BLK-Y 11 and BLK-A 14 as follows. The signal generating section 21 generates the test signal for the connection verification, and supplies it to the output terminal 13 of the BLK-Y 11. Subsequently, the connection verification section 20 compares the signal level supplied from the input section 18 with that supplied from the input section 19. However, this is not essential. For example, the interconnection between the BLK-Y 11 and BLK-A 14 can also be verified as follows. The signal generating section 21 supplies the test signal not only to the output terminal 13 of the BLK-Y 11 but also to the connection verification section 22. Subsequently, the connection verification section 22 compares the signal level of the test signal generated by the signal generating section 21 with the signal level supplied from the input section 19.

Thus, the present embodiment 3 offers an advantage of being able to simplify the circuit configuration of the connection verification apparatus in addition to the advantage of the foregoing embodiment 2.

Figure 4:
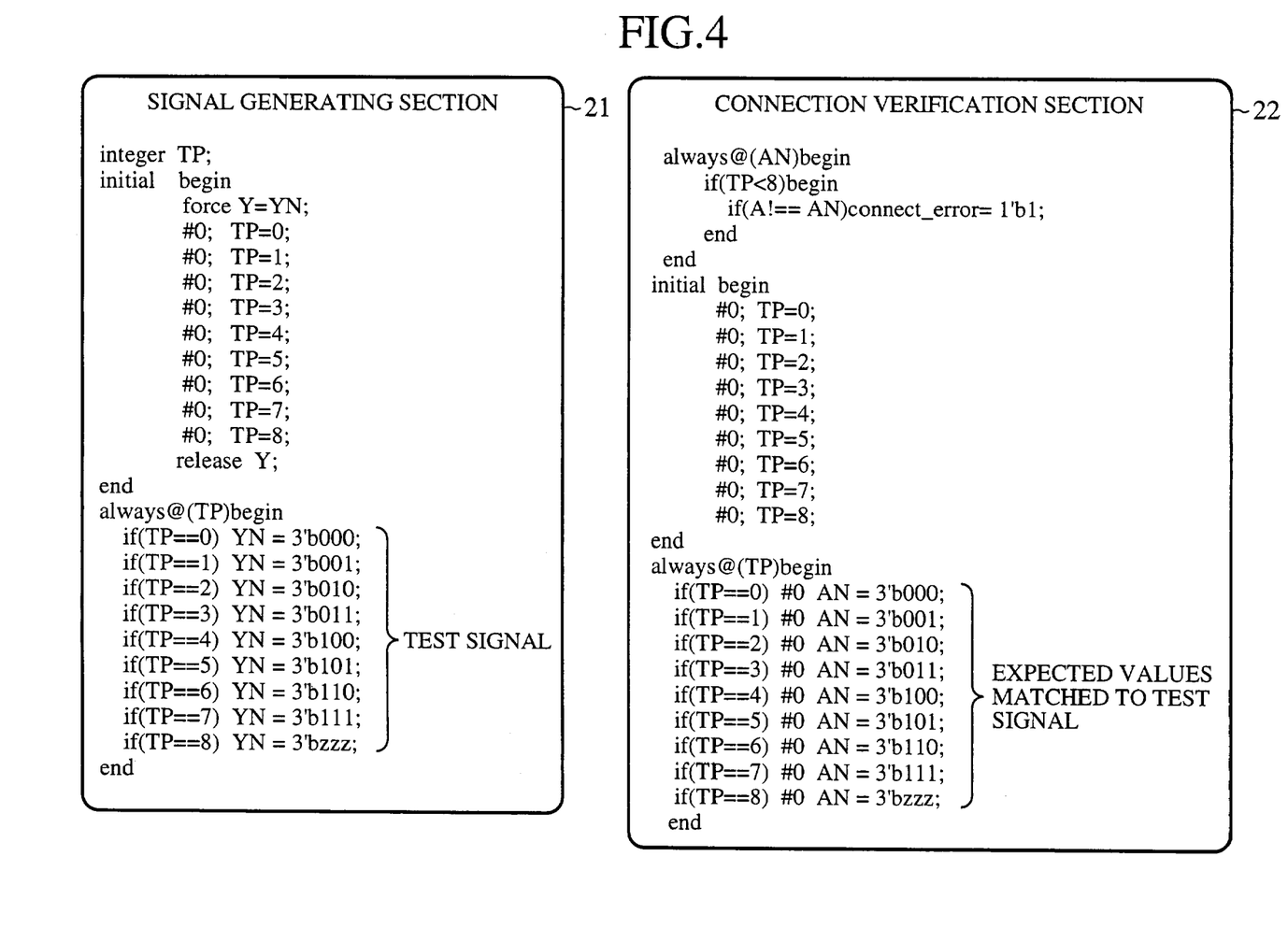
FIG. 4 is a schematic diagram illustrating the processing contents of a signal generating section and connection verification section.

FIG. 4 is a schematic diagram illustrating the processing of the signal generating section 21 and connection verification section 22. It is assumed in FIG. 4 that the number of the signal lines 17 connecting the BLK-Y 11 with the BLK-A 14 is three, and the signal generating section 21 sequentially varies the signal level of the test signal supplied to the output terminals Y1–Y3 eight times. This is performed by varying the signal levels YN of the test signal by varying the variable TP from zero to eight. For example, when TP=1, the signal levels YN are placed at Y1="0", Y2="0" and Y3="1", and when TP=2, they are placed at Y1="0", Y2="1" and Y3="0".

On the other hand, the connection verification section 22 produces the expected value AN identical to the test signal by varying the variable TP from zero to eight, and verifies the interconnection between the BLK-Y 11 and BLK-A 14 by comparing the expected value AN with the signal level A supplied from the input section 19. If the expected value AN is not equal to the signal level A, the connection verification section 22 places the variable connect_error to "1", and outputs the verification result indicating an abnormal connection.

Incidentally, after sequentially varying the signal levels of the test signal supplied to the output terminals Y1–Y3 eight times (after completing the connection verification), the signal generating section 21 forcibly disconnects the signal generating section 21 from the output terminals Y1–Y3 by setting "release Y". Accordingly, the processing has no effect on the logic simulation other than the verification of the interconnection.

Embodiment 4

Figure 5:
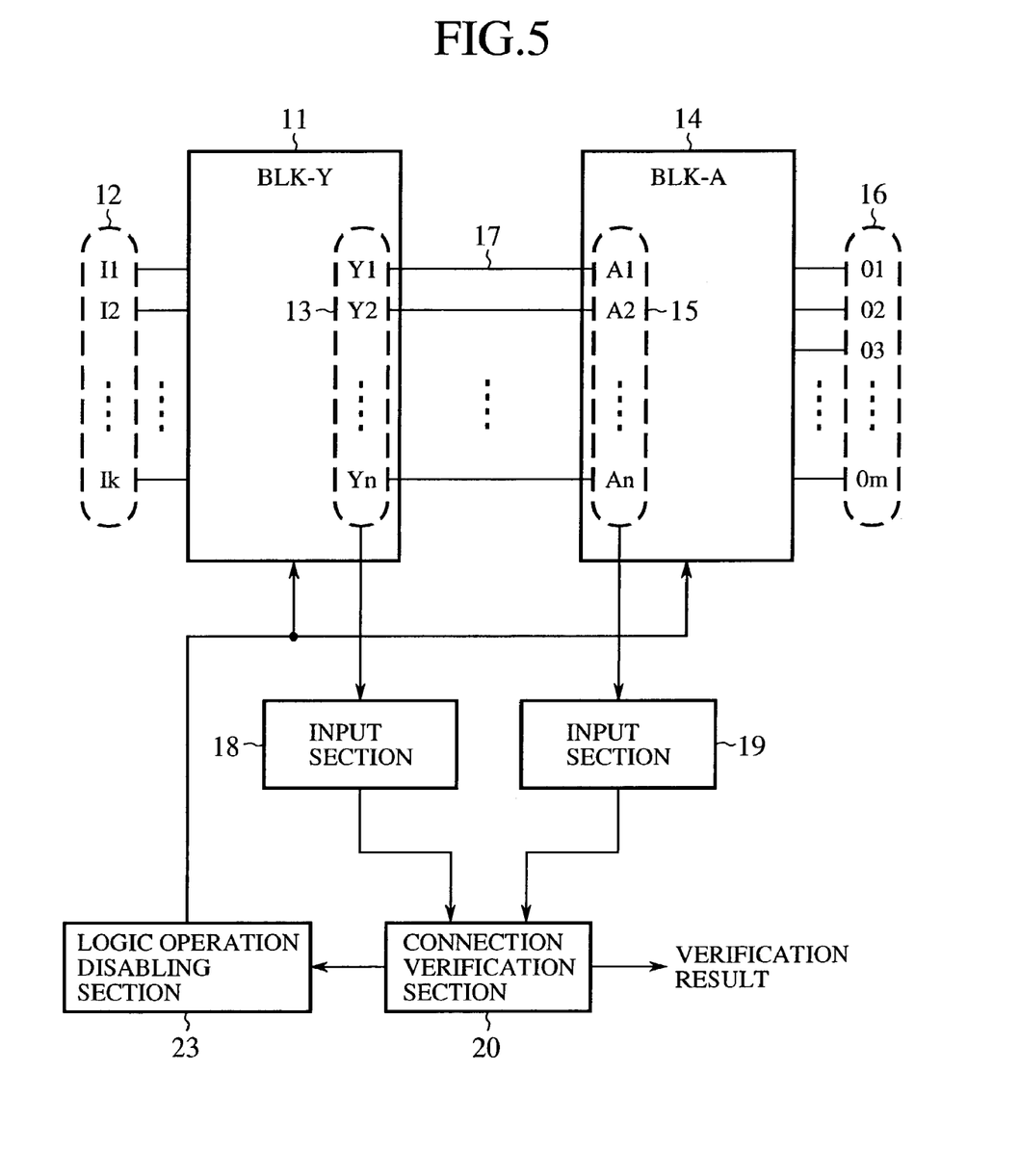
FIG. 5 is a block diagram showing a configuration of an embodiment 4 of the connection verification apparatus in accordance with the present invention.
Figure 6:
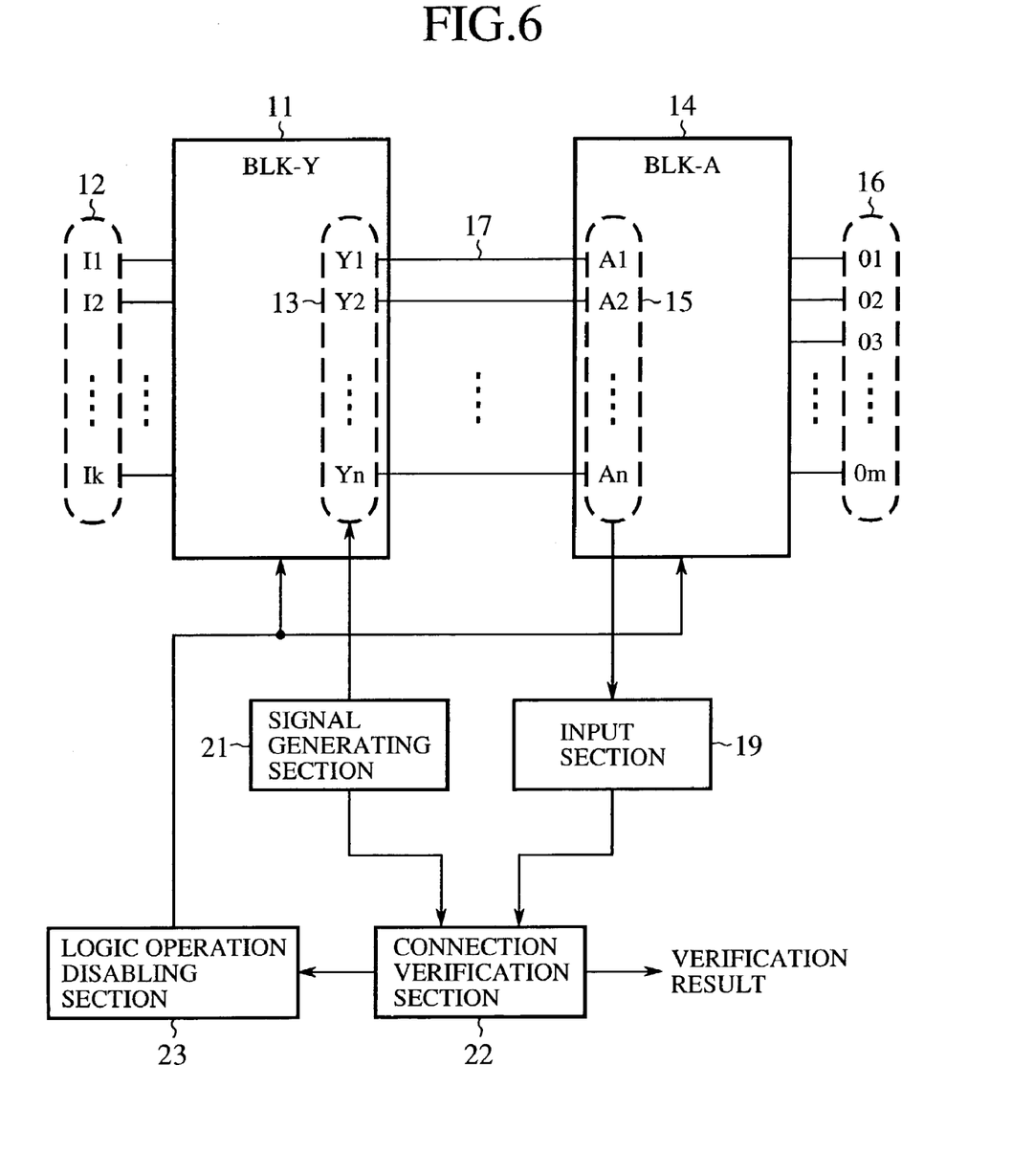
FIG. 6 is a block diagram showing another configuration of the embodiment 4 of the connection verification apparatus in accordance with the present invention.

FIGS. 5 and 6 are block diagrams each showing a configuration of an embodiment 4 of the connection verification apparatus in accordance with the present invention. In FIGS. 5 and 6, the same reference numerals designate the same or like portions to those of FIGS. 1 and 3, and the description thereof is omitted here.

In these figures, the reference numeral 23 designates a logic operation disabling section for inhibiting the logic operation of at least one of the BLK-Y 11 and BLK-A 14 if the connection verification section 20 or 22 detects any connection imperfection between the BLK-Y 11 and BLK-A 14.

Although the foregoing embodiments 1–3 are configured such that the connection verification section 20 or 22 verifies the interconnection between the BLK-Y 11 and BLK-A 14, this is not essential. For example, a configuration is also possible in which when the connection verification section 20 or 22 detects the imperfection in the interconnection between the BLK-Y 11 and BLK-A 14, the logic operation disabling section 23 inhibits the logic operation of at least one of the BLK-Y 11 and BLK-A 14.

The logic operation disabling section 23 can inhibit the logic operation of the BLK-Y 11 and the following stages by setting the output terminals Y1–Y3 of the BLK-Y 11 to undefined values or by halting the internal clock of the BLK-Y 11.

Alternately, the logic operation disabling section 23 can inhibit the logic operation of the BLK-A 14 and the following stages by placing the input terminals A1–An of the BLK-A 14 at undefined values, or by halting the internal clock of the BLK-A 14.

Thus, the present embodiment 4 inhibits the logic operation of the BLK-Y 11 or BLK-A 14 if the interconnection between the BLK-Y 11 and BLK-A 14 includes any imperfection. Consequently, it offers an advantage of being able to detect a defective portion in the interconnection between the BLK-Y 11 and BLK-A 14 quickly.

Embodiment 5

Figure 7:
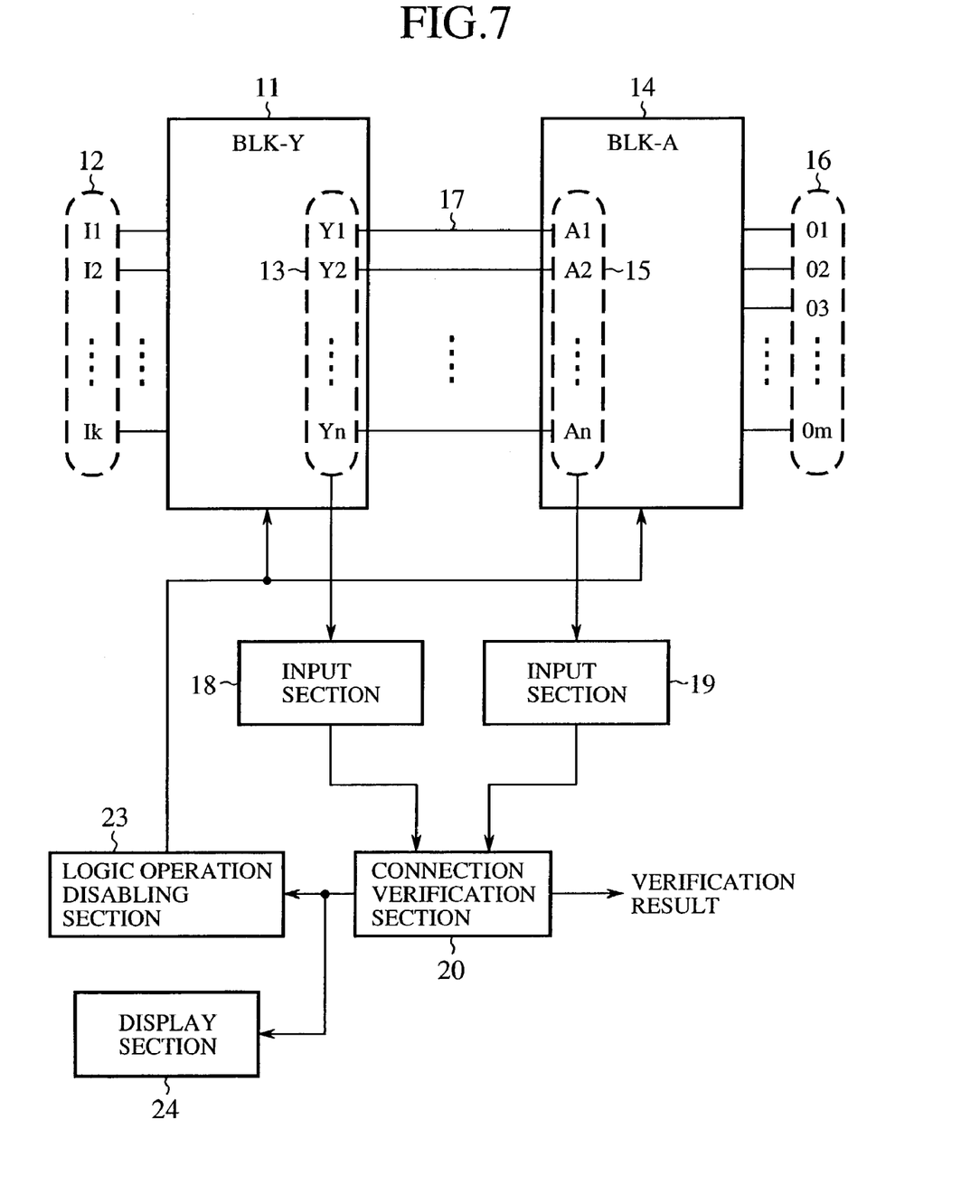
FIG. 7 is a block diagram showing a configuration of an embodiment 5 of the connection verification apparatus in accordance with the present invention.
Figure 8:
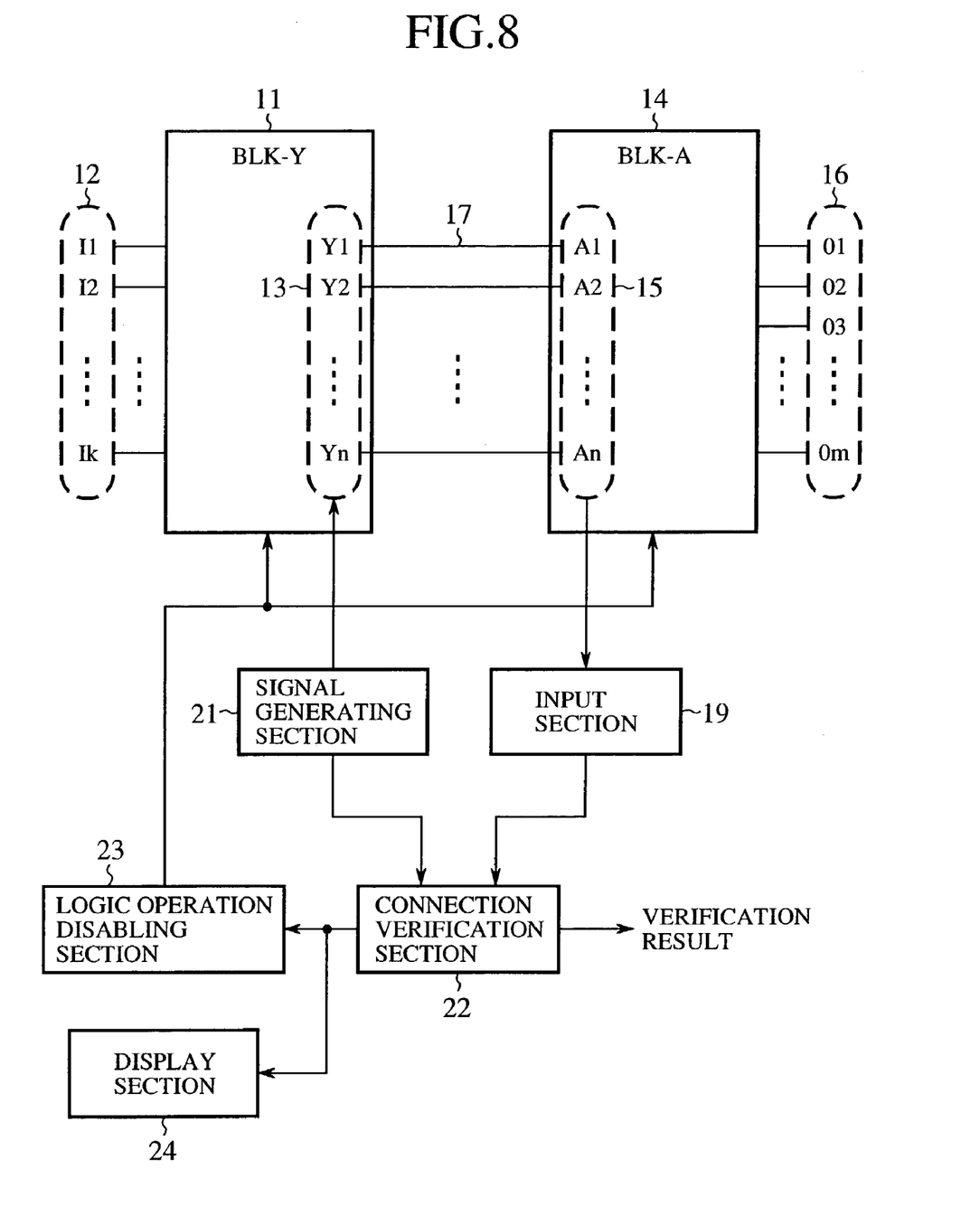
FIG. 8 is a block diagram showing another configuration of the embodiment 5 of the connection verification apparatus in accordance with the present invention.

FIGS. 7 and 8 are block diagrams each showing a configuration of an embodiment 5 of the connection verification apparatus in accordance with the present invention. In FIGS. 7 and 8, the same reference numerals designate the same or like portions to those of FIGS. 5 and 6, and the description thereof is omitted here.

In these figures, the reference numeral 24 designates a display section for showing information that the interconnection includes the connection imperfection if the connection verification section 20 and 22 detects a connection imperfection between the BLK-Y 11 and BLK-A 14.

The foregoing embodiments 1–3 are configured such that the connection verification section 20 or 22 verifies the interconnection between the BLK-Y 11 and BLK-A 14. However, a configuration is also possible in which the display section 24 indicates that the interconnection has the imperfection if the connection verification section 20 or 22 detects the imperfection in the interconnection between the BLK-Y 11 and BLK-A 14.

Thus, the present embodiment 5 offers an advantage of enabling a user to immediately recognize that the interconnection includes an imperfection.

Although the configuration described above supposes the imperfection in the entire interconnection between the BLK-Y 11 and BLK-A 14 rather than the imperfection in the interconnections between the individual terminals, the individual display of the imperfection in the interconnections between the individual terminals is also possible. This enables the user to recognize which interconnection has the imperfection at once.

Embodiment 6

Figure 9:
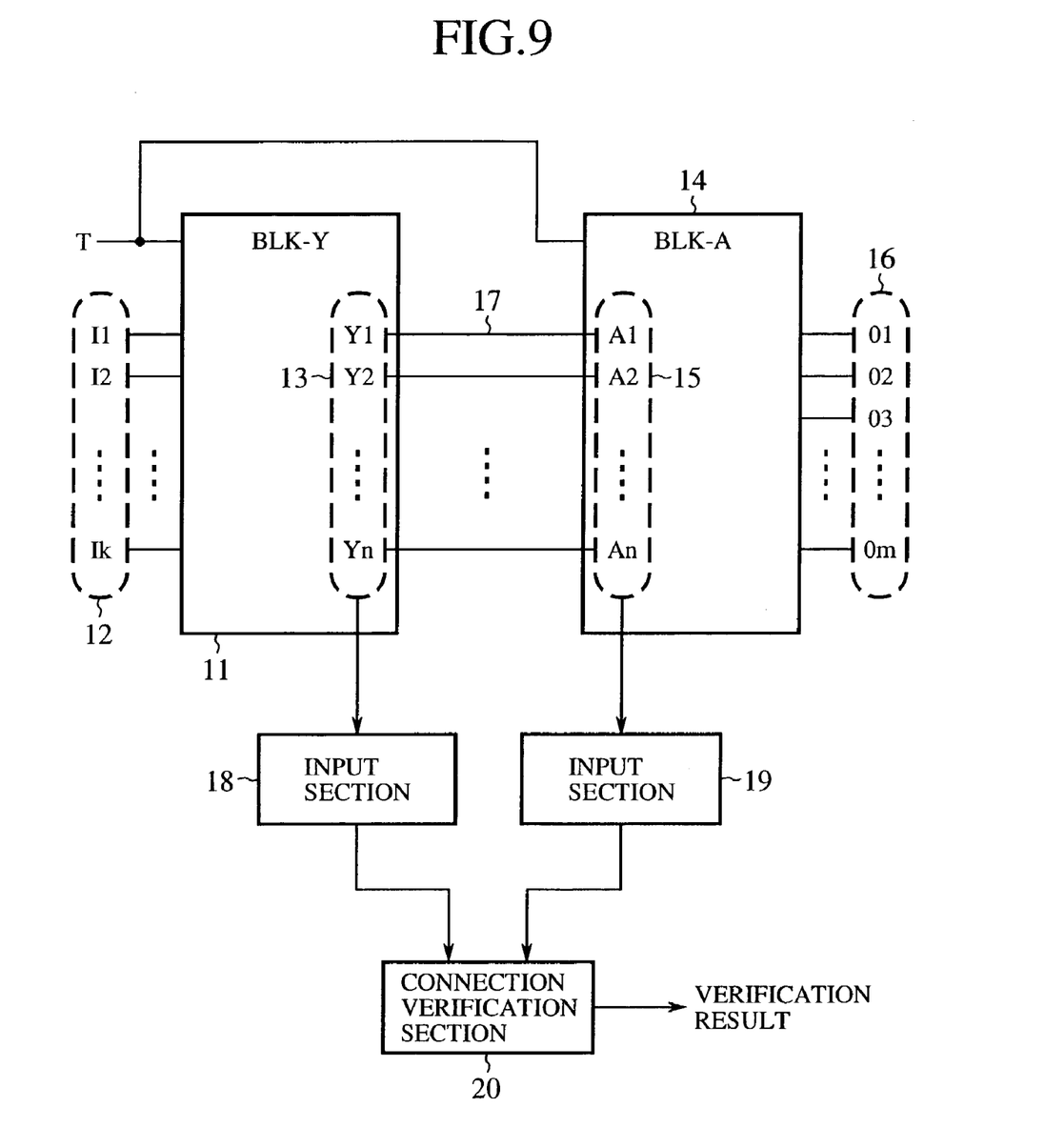
FIG. 9 is a block diagram showing a configuration of an embodiment 6 of the connection verification apparatus in accordance with the present invention.

The foregoing embodiment 1 does not mention of the input timing of the signal levels to the input sections 18 and 19. However, when the BLK-Y 11 and BLK-A 14 receive a synchronizing signal T from the outside as shown in FIG. 9, the input sections 18 and 19 can load the signal levels in synchronism with the synchronizing signal T.

Thus, the present embodiment 6 offers an advantage of being able to specify the verification timing of the interconnection from the outside.

Embodiment 7

Figure 10:
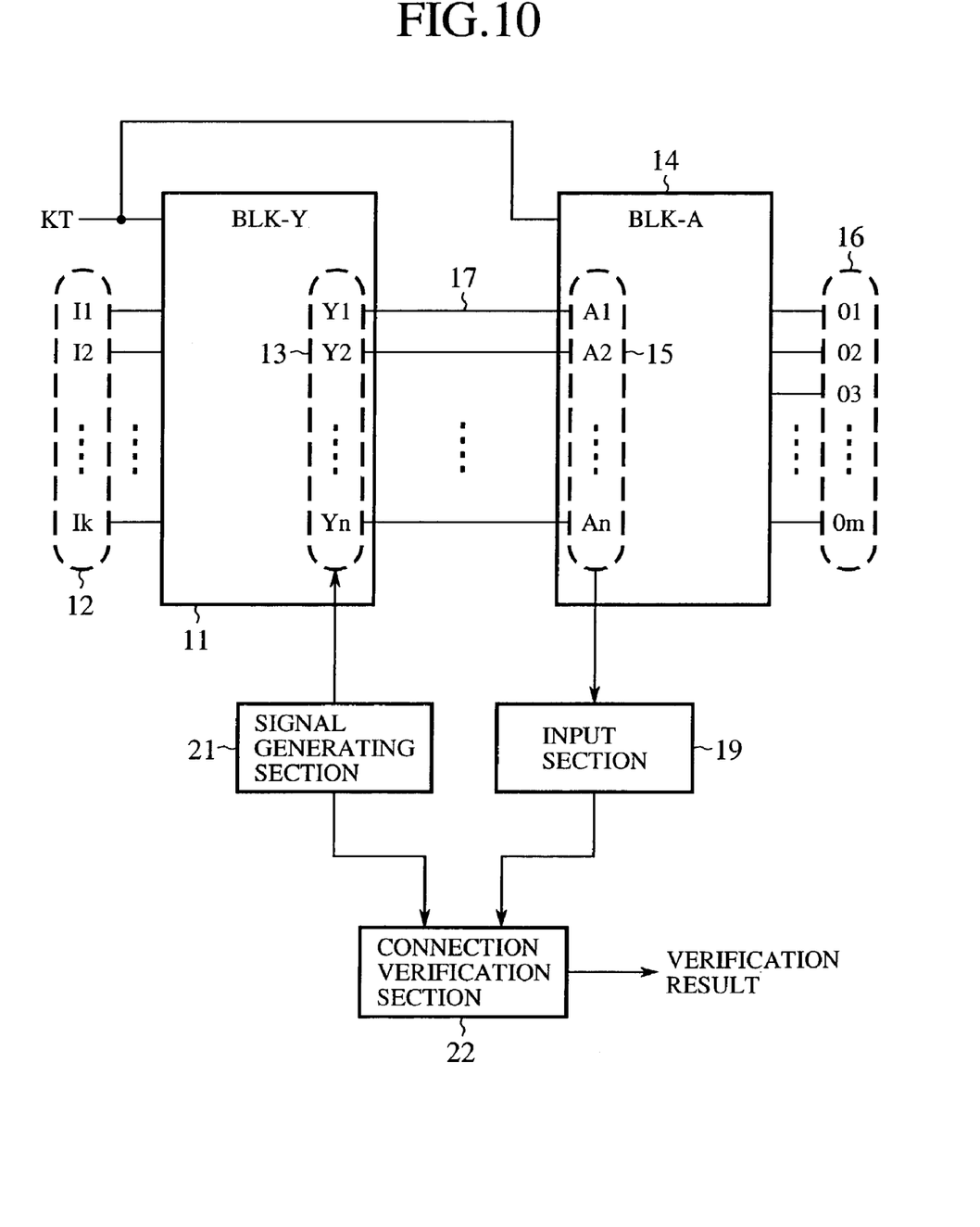
FIG. 10 is a block diagram showing a configuration of an embodiment 7 of the connection verification apparatus in accordance with the present invention.

The foregoing embodiment 3 does not mention of the input timing of the test signal level to the signal generating section 21 or the input timing of the signal level to the input section 19. However, when the BLK-Y 11 and BLK-A 14 receive a synchronizing signal KT from the outside as shown in FIG. 10, the signal generating section 21 can supply the test signal to the output terminal 13 of the BLK-Y 11 in synchronism with the synchronizing signal KT, and the input section 19 can load the signal level in synchronism with the synchronizing signal KT.

Thus, the present embodiment 7 offers an advantage of being able to specify the verification timing of the interconnection from the outside.

Embodiment 8

Figure 11:
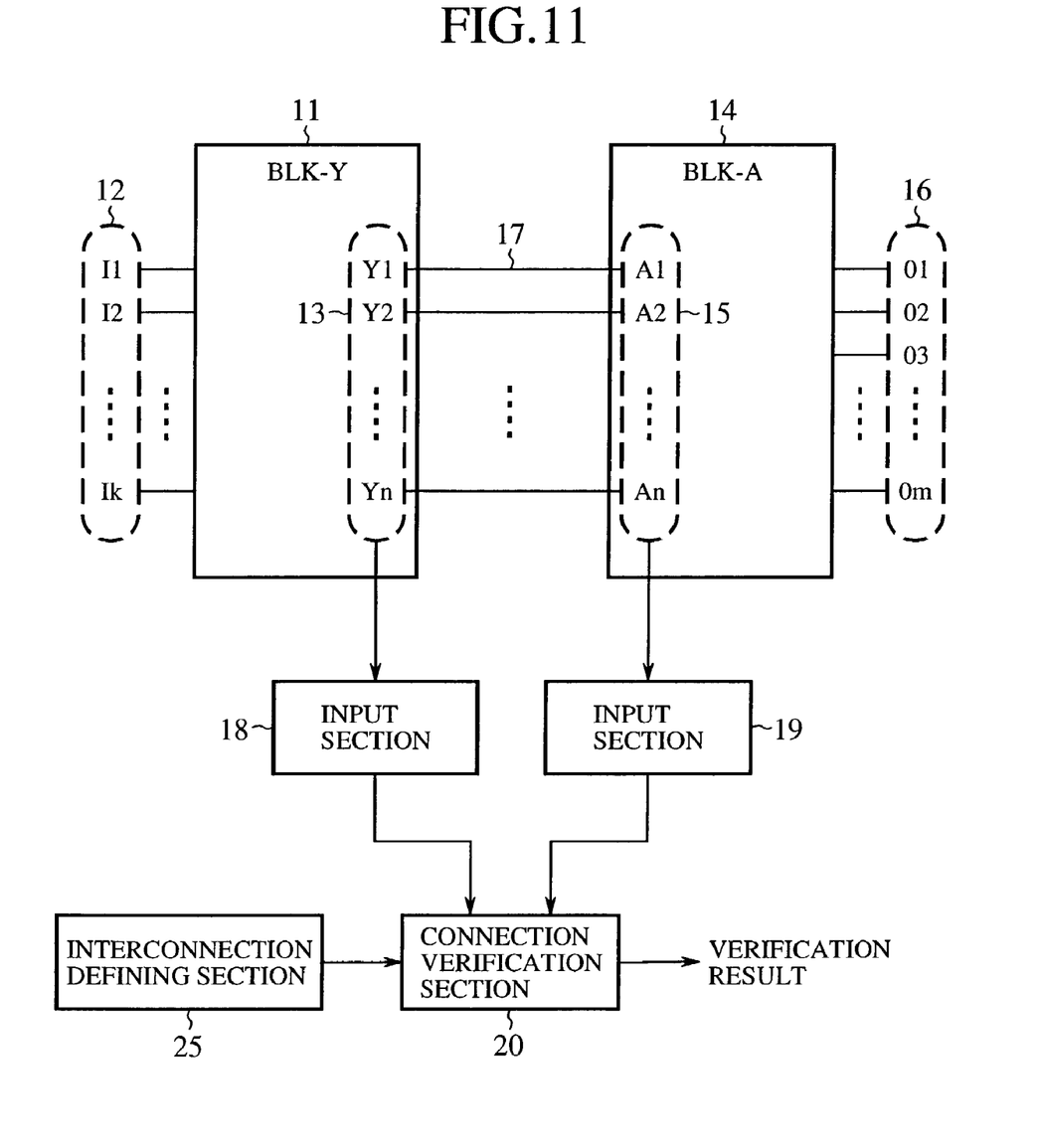
FIG. 11 is a block diagram showing a configuration of an embodiment 8 of the connection verification apparatus in accordance with the present invention.

FIG. 11 is a block diagram showing a configuration of an embodiment 8 of the connection verification apparatus in accordance with the present invention. In FIG. 11, the same reference numerals designate the same or like portions to those of FIG. 1, and the description thereof is omitted here.

In FIG. 11, the reference numeral 25 designates an interconnection defining section for defining the correspondence between the input terminals A1–An of the BLK-A 14 and the output terminals Y1–Yn of the BLK-Y 11.

Although the foregoing embodiment 1 supposes that the output terminals Y1–Yn of the BLK-Y 11 corresponding to the input terminals A1–An of the BLK-A 14 are fixed such as Y1 to A1, Y2 to A2, . . . , and Yn to An, this is not essential. For example, a configuration is also possible in which a user can define the input terminals A1–An of the BLK-A 14 corresponding to the output terminals Y1–Yn of the BLK-Y 11 using the interconnection defining section 25.

When verifying the interconnection between the BLK-Y 11 and BLK-A 14, the connection verification section 20 refers to the definition contents of the interconnection defining section 25 to recognize the input terminals A1–An of the BLK-A 14 corresponding to the output terminals Y1–Yn of the BLK-Y 11, and compares the signal levels of the corresponding terminals.

The present embodiment 8 offers an advantage of being able to cope with a design modification that changes the interconnection between the BLK-Y 11 and BLK-A 14 by only changing the definition contents of the interconnection defining section 25.

Embodiment 9

Figure 12:
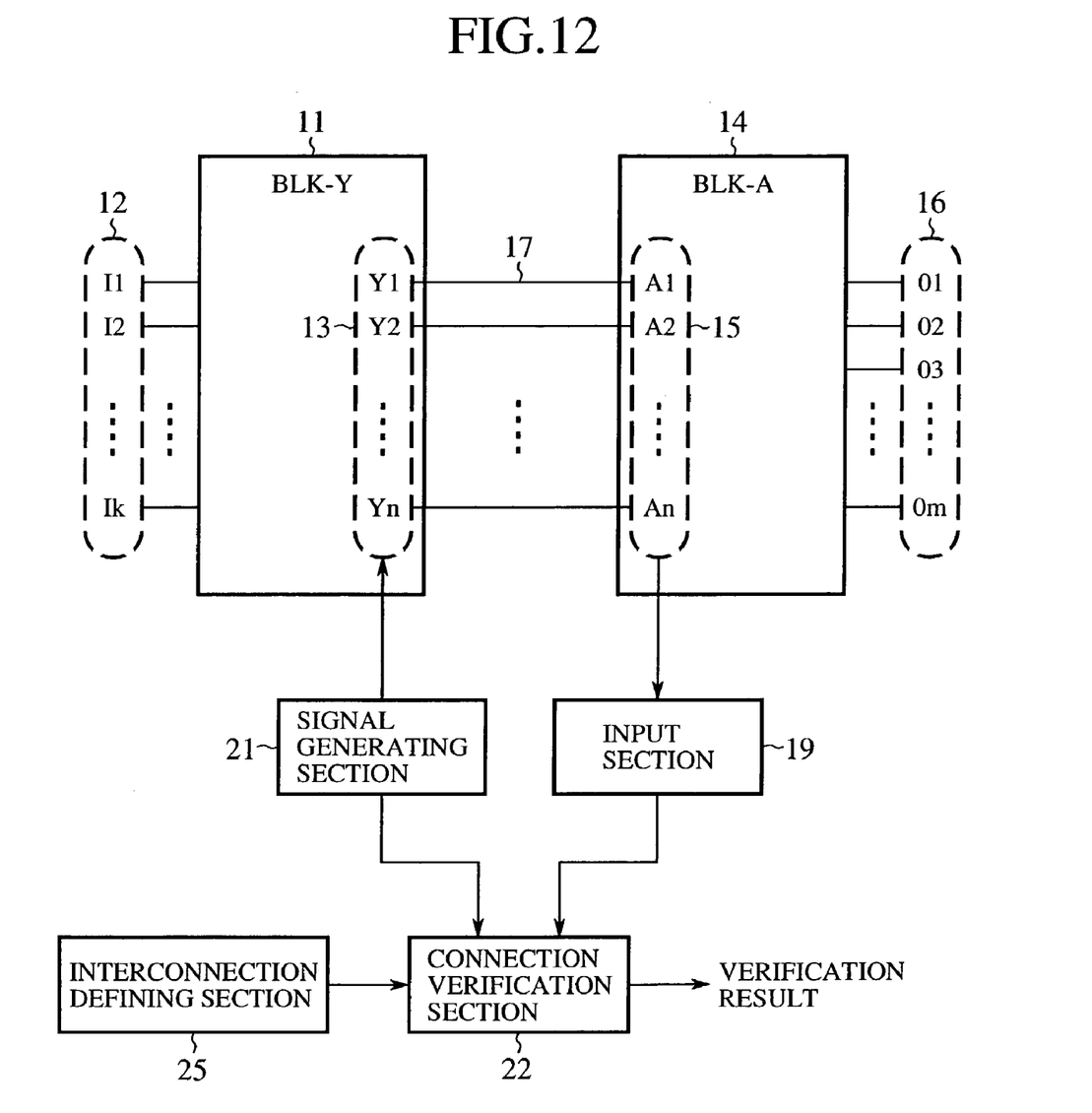
FIG. 12 is a block diagram showing a configuration of an embodiment 9 of the connection verification apparatus in accordance with the present invention.

Although the foregoing embodiment 3 supposes that the output terminals Y1–Yn of the BLK-Y 11 corresponding to the input terminals A1–An of the BLK-A 14 are fixed such as Y1 to A1, Y2 to A2, . . . , and Yn to An, this is not essential. For example, a configuration is also possible in which a user can define the input terminals A1–An of the BLK-A 14 corresponding to the output terminals Y1–Yn of the BLK-Y 11 using the interconnection defining section 25 as shown in FIG. 12.

When verifying the interconnection between the BLK-Y 11 and BLK-A 14, the connection verification section 22 refers to the definition contents of the interconnection defining section 25 to recognize the input terminals A1–An of the BLK-A 14 corresponding to the output terminals Y1–Yn of the BLK-Y 11, and compares the signal levels of the corresponding terminals.

The present embodiment 9 offers an advantage of being able to cope with a design modification that changes the interconnection between the BLK-Y 11 and BLK-A 14 by only changing the definition contents of the interconnection defining section 25.

Embodiment 10

Although the foregoing embodiments 1–9 do not mention, the function verification and logic verification of the BLK-Y 11 and BLK-A 14 (and of the entire semiconductor integrated circuit) are sometimes performed in addition to the verification of the interconnection between the BLK-Y 11 and BLK-A 14.

However, even though the function verification or logic verification of the BLK-Y 11 and BLK-A 14 is carried out before the verification of the interconnection between the BLK-Y 11 and BLK-A 14, and a defective is detected, it is difficult to make a decision as to whether the defective comes from the function or logic imperfection or from the interconnection imperfection. Thus, a lot of verification time will be consumed.

Figure 13:
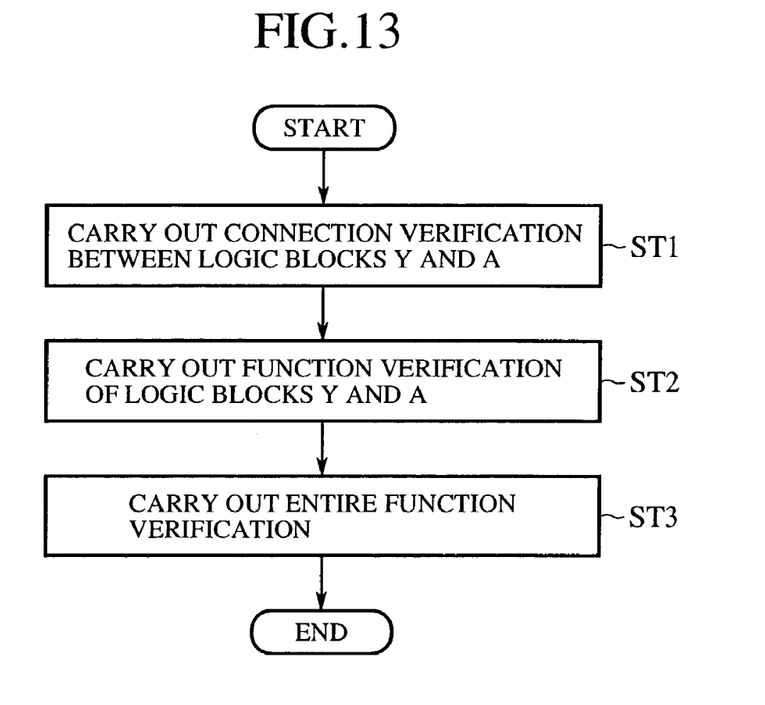
FIG. 13 is a flowchart illustrating a processing procedure of an embodiment 10 of the connection verification apparatus in accordance with the present invention.
Figure 14:
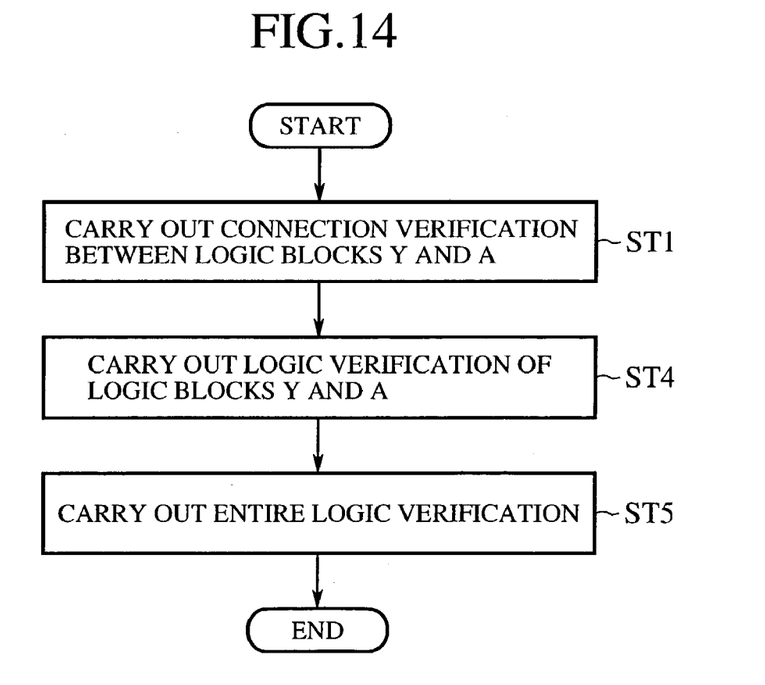
FIG. 14 is a flowchart illustrating another processing procedure of the embodiment 10 of the connection verification apparatus in accordance with the present invention.

In view of this, when carrying out the function verification or logic verification of the BLK-Y 11 and BLK-A 14 together with the verification of the interconnection between the BLK-Y 11 and BLK-A 14, the present embodiment 10 performs them as shown in FIGS. 13 and 14. First, it verifies the interconnection between the BLK-Y 11 and BLK-A 14 (step ST1), and then carries out the function verification or logic verification of BLK-Y 11 and BLK-A 14 (steps ST2 and ST3, or steps ST4 and ST5).

According to the present embodiment 10, when the function verification or logic verification detects a defective, it can specify that the function or logic causes the imperfection at once. Thus, the present embodiment 10 offers an advantage of being able to reduce the verification time.

What is claimed is:

1. A connection verification apparatus comprising:
    a first input section for receiving a signal level from an output terminal of a first logic block;
    a second input section for receiving a signal level from an input terminal of a second logic block connected to the output terminal of said first logic block, wherein said first and second logic blocks constitute semiconductor integrated circuit; and
    a connection verification section for verifying interconnection between said first logic block and said second logic block by comparing the signal level supplied from said first input section with the signal level supplied from said second input section.

2. The connection verification apparatus according to claim 1, further comprising a signal generating section for generating a test signal for connection verification, and for supplying the test signal to the output terminal of said first logic block.

3. The connection verification apparatus according to claim 1, further comprising a logic operation disabling section for inhibiting logic operation of at least one of said first logic block and said second logic block when said connection verification section detects a connection imperfection between said first logic block and said second logic block.

4. The connection verification apparatus according to claim 1, further comprising a display section for displaying information about the connection imperfection detected by said connection verification section.

5. The connection verification apparatus according to claim 1, wherein said first input section and said second input section receive their signal levels in synchronization with a synchronizing signal.

6. The connection verification apparatus according to claim 1, further comprising a defining section for defining correspondence between the output terminal of said first logic block and the input terminal of said second logic block, wherein referring to definition contents of said defining section, said connection verification section compares the signal level supplied from said first input section with the signal level supplied from said second input section.

7. The connection verification apparatus according to claim 1, wherein said connection verification section carries out at least one of function verification and logic verification of said first logic block and said second logic block, after completing the connection verification between said first logic block and said second logic block.

8. A connection verification apparatus comprising:
    a signal generating section for generating a test signal for connection verification, and for supplying the test signal to an output terminal of a first logic block;
    an input section for receiving a signal level from an input terminal of a second logic block connected to the output terminal of said first logic block, wherein said first and second logic blocks constitute semiconductor integrated circuit; and
    a connection verification section for verifying interconnection between said first logic block and said second logic block by comparing a signal level of the test signal generated by said signal generating section with the signal level supplied from said input section.

9. The connection verification apparatus according to claim 8, further comprising a logic operation disabling section for inhibiting logic operation of at least one of said first logic block and said second logic block when said connection verification section detects a connection imperfection between said first logic block and said second logic block.

10. The connection verification apparatus according to claim 8, further comprising a display section for displaying information about the connection imperfection detected by said connection verification section.

11. The connection verification apparatus according to claim 8, wherein said signal generating section supplies the test signal to the output terminal of said first logic block in synchronization with a synchronizing signal, and said input section receives the signal level in synchronization with the synchronizing signal.

12. The connection verification apparatus according to claim 8, further comprising a defining section for defining correspondence between the output terminal of said first logic block and the input terminal of said second logic block, wherein referring to definition contents of said defining section, said connection verification section compares the signal level of the test signal generated by said signal generating section with the signal level supplied from said input section.

13. The connection verification apparatus according to claim 8, wherein said connection verification section carries out at least one of function verification and logic verification of said first logic block and said second logic block, after completing the connection verification between said first logic block and said second logic block.

* * * * *